(12) United States Patent
Finney et al.

(10) Patent No.: US 9,590,091 B2
(45) Date of Patent: Mar. 7, 2017

(54) MINORITY CARRIER CONVERSION STRUCTURE

(71) Applicant: Infineon Technologies AG, Neubiberg (DE)

(72) Inventors: Adrian Finney, Villach (AT); Paolo Del Croce, Villach (AT); Luca Petruzzi, Goedersdorf (AT); Norbert Krischke, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/466,198

(22) Filed: Aug. 22, 2014

(65) Prior Publication Data

US 2016/0056280 A1 Feb. 25, 2016

(51) Int. Cl.

| | |
|---|---|
| *H01L 27/108* | (2006.01) |
| *H01L 29/78* | (2006.01) |
| *H01L 27/06* | (2006.01) |
| *H01L 29/06* | (2006.01) |
| *H01L 27/092* | (2006.01) |
| *H01L 21/8238* | (2006.01) |

(52) U.S. Cl.
CPC ...... *H01L 29/7811* (2013.01); *H01L 27/0629* (2013.01); *H01L 27/0922* (2013.01); *H01L 29/0607* (2013.01); *H01L 29/0688* (2013.01); *H01L 29/7805* (2013.01); *H01L 21/823878* (2013.01); *H01L 21/823892* (2013.01)

(58) Field of Classification Search
CPC .. H01L 21/761; H01L 27/0921; H01L 27/108
See application file for complete search history.

(56) References Cited

U.S. PATENT DOCUMENTS

| | | | | |
|---|---|---|---|---|
| 4,980,747 | A * | 12/1990 | Hutter | H01L 21/763 257/513 |
| 5,545,917 | A * | 8/1996 | Peppiette | H01L 27/0248 257/500 |
| 6,800,925 | B2 | 10/2004 | Rossmeier et al. | |
| 7,242,059 | B2 | 7/2007 | Negoro et al. | |
| 7,319,263 | B2 * | 1/2008 | Horn | H01L 27/0623 257/517 |
| 2003/0136990 | A1 * | 7/2003 | Rossmeier | H01L 21/761 257/297 |
| 2008/0007277 | A1 * | 1/2008 | Backhaus | G01R 27/18 324/713 |

(Continued)

*Primary Examiner* — John C Ingham
*Assistant Examiner* — Ismail Muse
(74) *Attorney, Agent, or Firm* — Murphy, Bilak & Homiller, PLLC

(57) ABSTRACT

According to an embodiment of a semiconductor device, the semiconductor device includes a power device well in a semiconductor substrate, a logic device well in the substrate and spaced apart from the power device well by a separation region of the substrate, and a minority carrier conversion structure including a first doped region of a first conductivity type in the separation region, a second doped region of a second conductivity type in the separation region and a conducting layer connecting the first and second doped regions. The second doped region includes a first part interposed between the first doped region and the power device well and a second part interposed between the first doped region and the logic device well.

20 Claims, 5 Drawing Sheets

(56) References Cited

U.S. PATENT DOCUMENTS

2012/0175730 A1* 7/2012 Stecher .............. H01L 21/761
                                                    257/520
2013/0093014 A1* 4/2013 Cho .................. H01L 27/0623
                                                    257/337

* cited by examiner

US 9,590,091 B2

MINORITY CARRIER CONVERSION STRUCTURE

TECHNICAL FIELD

The present application relates to semiconductor devices that include power and logic devices integrated in the same semiconductor substrate, in particular improved parasitic bipolar suppression in such integrated semiconductor devices.

BACKGROUND

Some semiconductor technologies include a vertical power device such as a power DMOS (double-diffused MOS) and at least one logic device well in which one or more logic devices are disposed. When the power device is reverse biased and the logic device well is at the negative substrate potential, most of the current flows through the power device and into the semiconductor substrate to provide a useful reverse current capability. However, a percentage of this minority carrier current flows out of the power device and into the logic device well through a lateral parasitic bipolar transistor. This current generates undesirable potential drops within the logic well and can trigger further parasitic devices, disrupting proper functionality of the logic device(s) disposed in the logic device well. It is desirable to more effectively suppress the lateral flow of minority carriers toward the logic device well in order to ensure proper operation of the logic devices when the power device is reverse biased.

SUMMARY

According to an embodiment of a semiconductor device, the semiconductor device comprises a semiconductor substrate having opposing first and second main surfaces, a first well extending into the semiconductor substrate from the first main surface, a second well extending into the semiconductor substrate from the first surface and spaced apart from the first well by a separation region of the semiconductor substrate, and a minority carrier conversion structure in the separation region. A vertical power device is disposed partly in the first well and has a vertical current path that extends in a direction perpendicular to the first and second main surfaces. A plurality of logic devices is disposed in the second well. The minority carrier conversion structure comprises a first doped region of the same conductivity type as the first and second wells that extends into the semiconductor substrate from the first main surface, a second doped region of the opposite conductivity type as the first doped region that extends into the semiconductor substrate from the first main surface and a conducting layer that connects the first and second doped regions. The first doped region is disposed closer to the second well than to the first well. The second doped region is wider between the first doped region and the first well than between the first doped region and the second well.

According to another embodiment of a semiconductor device, the semiconductor device comprises a power device well in a semiconductor substrate, a logic device well in the semiconductor substrate and spaced apart from the power device well by a separation region of the semiconductor substrate and a minority carrier conversion structure. The minority carrier conversion structure comprises a first doped region of a first conductivity type in the separation region, a second doped region of a second conductivity type in the separation region and a conducting layer connecting the first and second doped regions. The second doped region comprises a first part interposed between the first doped region and the power device well and a second part interposed between the first doped region and the logic device well.

According to another embodiment of a semiconductor device, the semiconductor device comprises a semiconductor substrate having opposing first and second main surfaces, a power device well extending into the semiconductor substrate from the first main surface, a logic device well extending into the semiconductor substrate from the first main surface and spaced apart from the power device well by a separation region of the semiconductor substrate, and a minority carrier conversion structure in the separation region. The minority carrier conversion structure comprises a first doped region of a first conductivity type that extends into the semiconductor substrate from the first main surface, a second doped region of a second conductivity type that extends into the semiconductor substrate from the first main surface and a conducting layer that connects the first and second doped regions. The first doped region extends through the second doped region in a direction perpendicular to the first and second main surfaces, such that the second doped region has a first part interposed between the first doped region and the power device well and a second part interposed between the first doped region and the logic device well.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a minority carrier conversion structure that suppresses lateral parasitic bipolar current flow from a power device well in a semiconductor substrate to a logic device well in the same substrate when a power device disposed in the power device well is reverse biased and the logic device well is at or closer to the backside potential of the substrate than the power device. The minority carrier conversion structure intercepts most minority carriers injected from the power device well into the semiconductor substrate when the power device is reverse-biased, and effectively converts the intercepted minority carriers into majority carriers. The minority carrier conversion structure receives a balancing majority carrier current. This majority carrier current crosses the minority current path of the lateral parasitic bipolar which has the added benefit of reducing the minority carrier lifetime.

The minority carrier conversion structure can be asymmetric in that the conversion structure receives more of the majority carriers from the semiconductor substrate between the conversion structure and the power device well than between the conversion structure and the logic device well. Also, the doped region of the minority carrier conversion structure that intercepts the minority carriers is disposed closer to the logic device well than to the power device well.

The term "well" as used herein refers to a doped region of a semiconductor substrate in which one or more semiconductor devices is at least partly manufactured or formed. In the case of a power semiconductor device such as a power transistor, power diode, etc., the term "power device well" refers to a doped region of a semiconductor substrate in which the power device is at least partly manufactured or formed. In the case of logic semiconductor devices such as FETs (field effect transistors), bipolar transistors, etc., the term "logic device well" refers to a doped region of a semiconductor substrate in which the logic devices are at least partly manufactured or formed.

Figure 1:
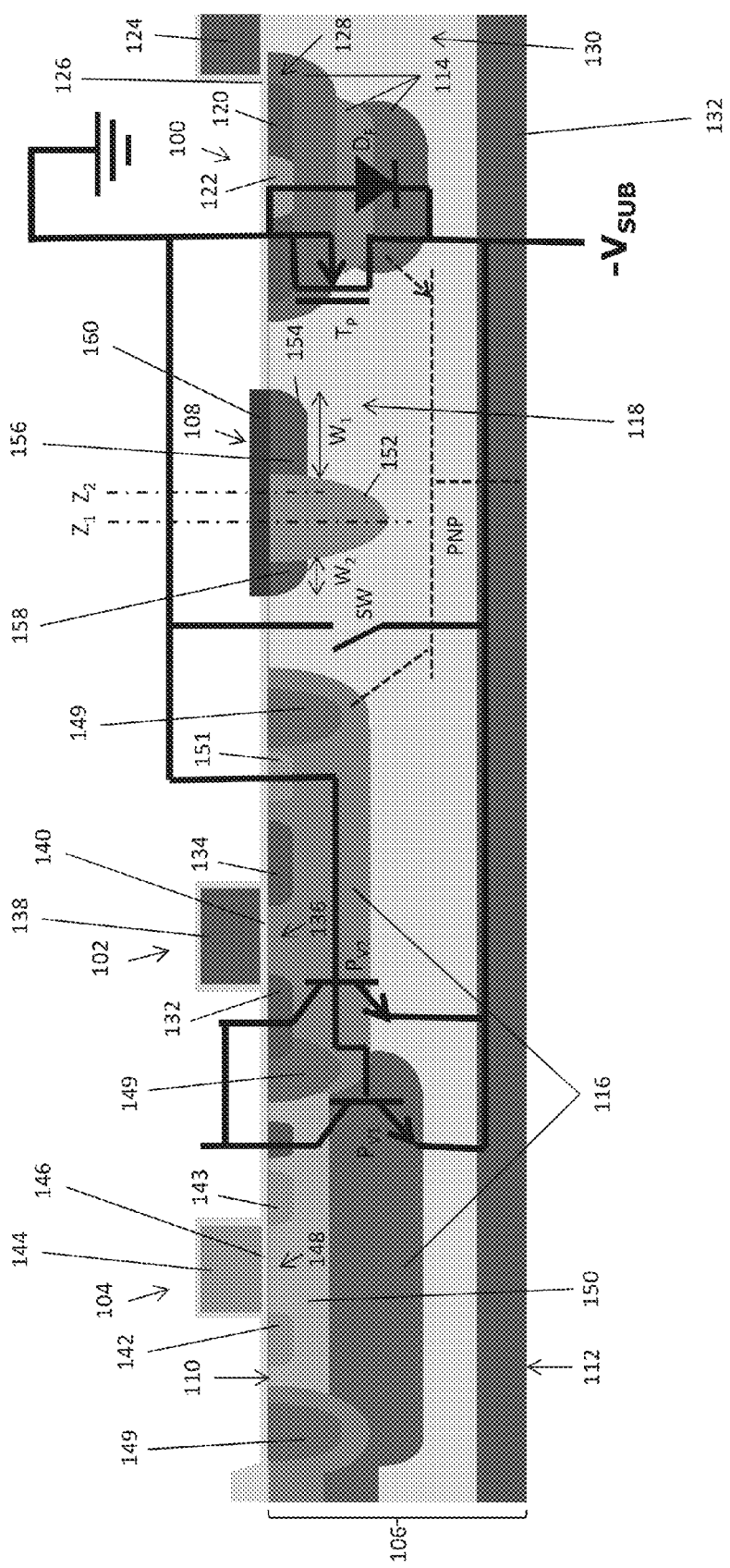
FIG. 1 illustrates a sectional view of an embodiment of a semiconductor device that includes power and logic devices integrated in the same semiconductor substrate, and a minority carrier conversion structure.

FIG. 1 illustrates an embodiment of a semiconductor device that includes power devices 100 and logic devices 102, 104 integrated in the same semiconductor substrate 106, and a minority carrier conversion structure 108 for suppressing lateral parasitic PNP current which arises in the substrate 106 when the power device 100 is reverse biased. The semiconductor substrate 106 can be a semiconductor wafer such as a silicon or compound semiconductor wafer, and can include one or more epitaxial layers formed on the wafer. The semiconductor substrate 106 has opposing first and second main surfaces 110, 112. A power device well 114 extends into the semiconductor substrate 106 from the first main surface 110. A logic device well 116 extends into the semiconductor substrate 106 from the first surface 110, and is spaced apart from the power device well 114 by a separation region 118 of the semiconductor substrate 106.

A vertical power device 100 is disposed partly in the power device well 114 and has a vertical current path that extends in a direction perpendicular to the first and second main surfaces 110, 112 of the substrate 106. A plurality of logic devices 102, 104 are disposed in the logic device well 116. In one purely illustrative example, the vertical power device 100 comprises a vertical power transistor $T_P$ and a free-wheeling diode $D_F$ connected antiparallel with the vertical power transistor. The vertical power transistor $T_P$ and free-wheeling diode $D_F$ are schematically illustrated in FIG. 1. The vertical power transistor $T_P$ is shown as a power MOSFET that includes a source region 120 and body contact 122, a gate electrode 124 insulated from the substrate 106 by a gate dielectric 126, a channel region 128 disposed in the power device well 114 between the source region 120 and the gate electrode 124, a drift region 130, and a drain region 132 at the second main surface 112 of the substrate 106. The logic devices are shown as NMOS (n-channel MOSFET) and PMOS (p-channel MOSFET) devices 102, 104 in FIG. 1. Each NMOS device 102 includes a source region 132, a drain region 134, a channel region 136 formed in the logic device well 116 between the source and drain regions 132, 134, and a gate electrode 138 insulated from the substrate 106 by a gate dielectric 140. Each PMOS device 104 similarly includes source and drain regions 142, 143 and a gate electrode 144 insulated from the substrate 106 by a gate dielectric 146. Unlike the NMOS devices 102, the channel region 148 of each PMOS device 104 is formed in a body region 150 having the opposite conductivity type as the logic device well 116. The NMOS and PMOS devices 102, 104 can be isolated in the substrate 106 by isolation regions 149.

The logic device well 116 is connected to a negative potential $-V_{SUB}$ (e.g. −0.7 V) of the semiconductor substrate 106 via a switch SW and a doped contact region 151 formed in the logic device well 116 when the vertical power transistor $T_P$ is reverse-biased and the free-wheeling diode $D_F$ is conducting. Minority carriers are injected from the power device well 114 into the semiconductor substrate 106 when the vertical power transistor $T_P$ is reverse-biased and the free-wheeling diode $D_F$ is conducting. Most of the minority carriers travel to a heavily doped region 132 at the second surface 112 of the semiconductor substrate 106. This heavily doped region 132 forms the drain of the power transistor $T_P$ and has the opposite conductivity type as the wells 114, 116. A more lightly doped drift region 130 of the same conductivity type as the heavily doped region 132 is interposed between the device wells 114, 116 and the heavily doped region 132. The more lightly doped drift region 130 can be e.g. an epitaxial layer.

In the case of p-type wells 114, 116 and an n-type heavily doped region 132 and drift region 130, a parasitic PNP device is formed between the power device well 114, the heavily doped region 132 and drift region 130, and the logic device well 116. Most of the minority carriers (holes in this example) injected from the power device well 114 into the semiconductor substrate 106 travel vertically from the emitter of the parasitic PNP to the base of the parasitic PNP which is formed by the heavily doped region 132 at the second surface 112 of the semiconductor substrate 106. A small portion of the minority carriers travel laterally from the emitter of the parasitic PNP through the drift region 130 toward the collector of the parasitic PNP which is formed by the logic device well 116. The minority carrier conversion structure 108 intercepts the minority carriers flowing toward the logic device well 116, and effectively converts the intercepted minority carriers into majority carriers which are received from the semiconductor substrate 106.

In more detail, the minority carrier conversion structure 108 is disposed in the separation region 118 of the semiconductor substrate 106 between the different wells 114, 116. The minority carrier conversion structure 108 comprises a first doped region 152 of the same conductivity type (e.g. p-type in the above example) as the wells 114, 116 and that extends into the semiconductor substrate 106 from the first main surface 110. The first doped region 152 of the minority carrier conversion structure 108 intercepts the minority carriers injected from the power device well 114 into the substrate 106 when the vertical power transistor $T_P$ is reverse-biased and the free-wheeling diode $D_F$ is conducting. The minority carrier conversion structure 108 further comprises a second doped region 154 of the opposite conductivity type (e.g. n-type in the above example) as the first doped region 152 that extends into the substrate 106 from the first main surface 110. In one embodiment, the first doped region 152 extends through the second doped region 154 in a direction perpendicular to the first and second main surfaces 110, 112 of the semiconductor substrate 106 such that the second doped region 154 has a first part 156 interposed between the first doped region 152 and the power device well 114 and a second part 158 interposed between the first doped region 152 and the logic device well 116.

The minority carrier conversion structure 108 also comprises a conducting layer 160 that connects the first and second doped regions 152, 154 of the conversion structure 108. The conducting layer 160 can be a metal layer or any other type of electrically conductive material e.g. such as heavily doped polysilicon or silicide suitable for connecting the first and second doped regions 152, 154 of the conversion structure 108. The conducting layer 160 effectively converts the minority carriers intercepted by the first doped region 152 of the minority carrier conversion structure 108 into majority carriers. The second doped region 154 of the minority carrier conversion structure 108 receives the balancing majority carriers from the semiconductor substrate 106 between the first doped region 152 and the power device well 114 and also between the first doped region 152 and the logic device well 116.

In one embodiment, the minority carrier conversion structure 108 is asymmetric in that the first part 156 of the second doped region 154 of the minority carrier conversion structure 108 is wider than the second part 158 of the second doped region 154 i.e. W1>W2. That is, the first doped region 152 is off-centered within the second doped region 154 such that the second doped region 154 is wider facing the power device well 114 than facing the logic device well 116. In other words, the first doped region 152 has a centered main axis ($Z_1$) that deviates from the geometrical center ($Z_2$) of the second doped region 154. As a result, the minority carrier conversion structure 108 receives more of the majority carriers from the semiconductor substrate 106 between the first doped region 152 of the conversion structure 108 and the power device well 114 via the wider part 156 of the second doped region 154 than between the first doped region 152 and the logic device well 116 via the narrower part 158 of the second doped region 154. In addition or alternatively, the minority carrier conversion structure 108 also can be considered asymmetric in that the first doped region 152 of the conversion structure 108 is disposed closer to the logic device well 116 than to the power device well 114. Such an asymmetric construction of the minority carrier conversion structure 108 allows for a more efficient conversion of the minority carriers flowing laterally toward the logic device well 116, preventing significant turn on of vertical parasitic devices $PV_1$, $PV_2$ formed in the logic device well 116 and therefore ensuring proper operation of the logic devices 102, 104 when the power device 100 is reverse biased. Particularly, minority carrier suppression is improved at high reverse substrate biases by placing the first doped region 152 of the minority carrier conversion structure 108 closer to the logic device well 116 than to the power device well 114 due to a lower minority carrier lifetime under the wider part 156 of the second doped region 154 as a consequence of the high vertical majority carrier current density.

Figure 2:
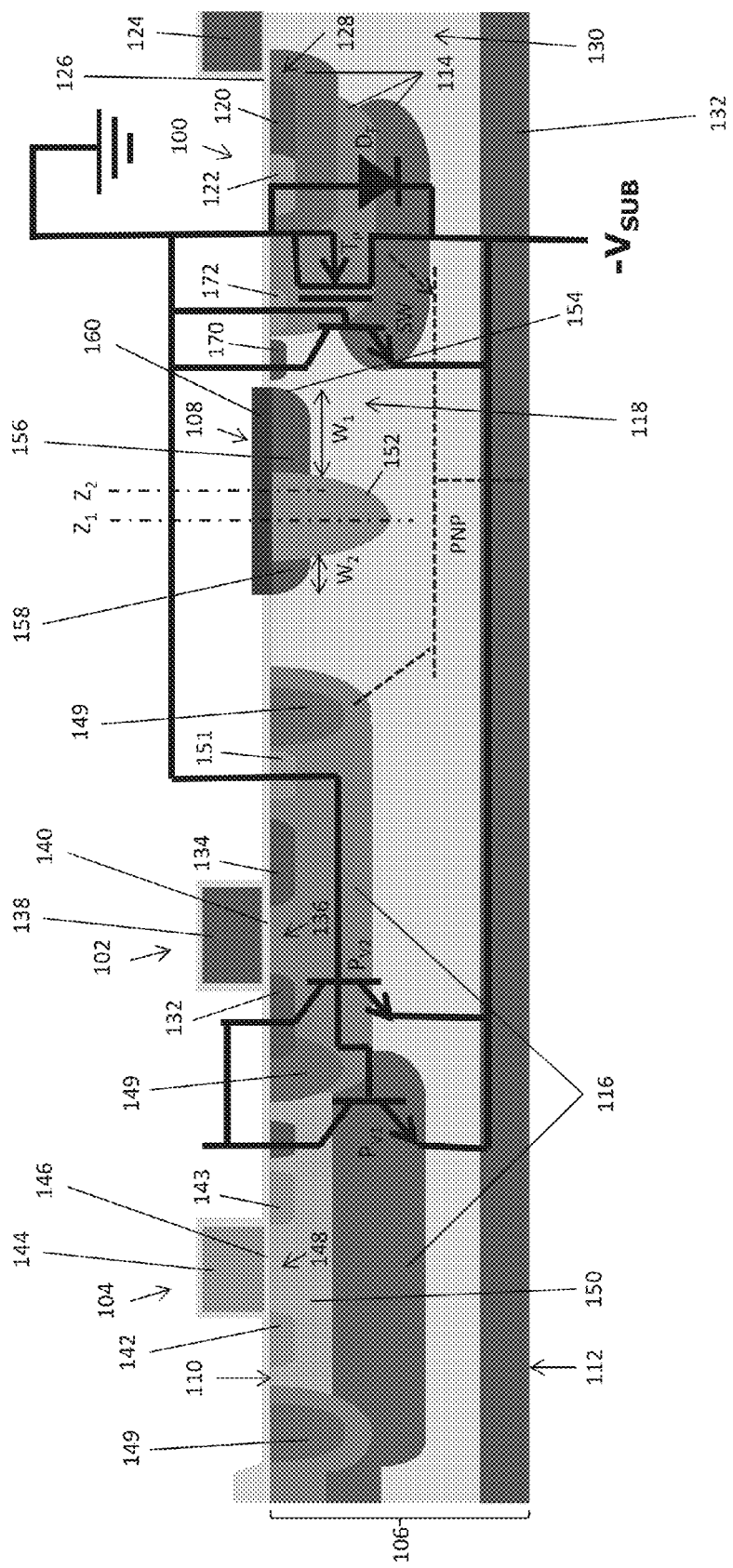
FIG. 2 illustrates a sectional view of another embodiment of a semiconductor device that includes power and logic devices integrated in the same semiconductor substrate, and a minority carrier conversion structure.

FIG. 2 illustrates another embodiment of a semiconductor device that includes power and logic devices 100, 102, 104 integrated in the same semiconductor substrate 106 with the minority carrier conversion structure 108. The embodiment shown in FIG. 2 is similar to the embodiment shown in FIG. 1. According to the embodiment of FIG. 2, the switch SW for connecting the logic device well 116 to the negative potential $-V_{SUB}$ of the semiconductor substrate 106 is integrated in the power device well 114. The switch SW is a vertical NPN integrated into the same well 114 as the power device 100. A highly doped region 170 of the same conductivity type as the drift region 130 is provided at the first surface 110 of the substrate 106 to form the collector of the vertical NPN switch SW. The base of the vertical NPN switch SW is formed by the power device well 114 and can include a highly doped base contact region 172, and the emitter region is formed by the drift region 130 and the highly doped collector 132 of the power device 100. The vertical NPN switch SW connects the logic device well 116 to the negative substrate potential $-V_{SUB}$ when the vertical power transistor $T_P$ is reverse-biased and the free-wheeling diode $D_F$ is conducting. The switch SW can be implemented in other forms e.g. such as a DMOS (double-diffused MOS) device in or outside the power device well 114. In each case, the minority carrier conversion structure 108 suppresses the lateral parasitic PNP current flow from the power device well 114 to the logic device well 116 as previously described herein.

Figure 3:
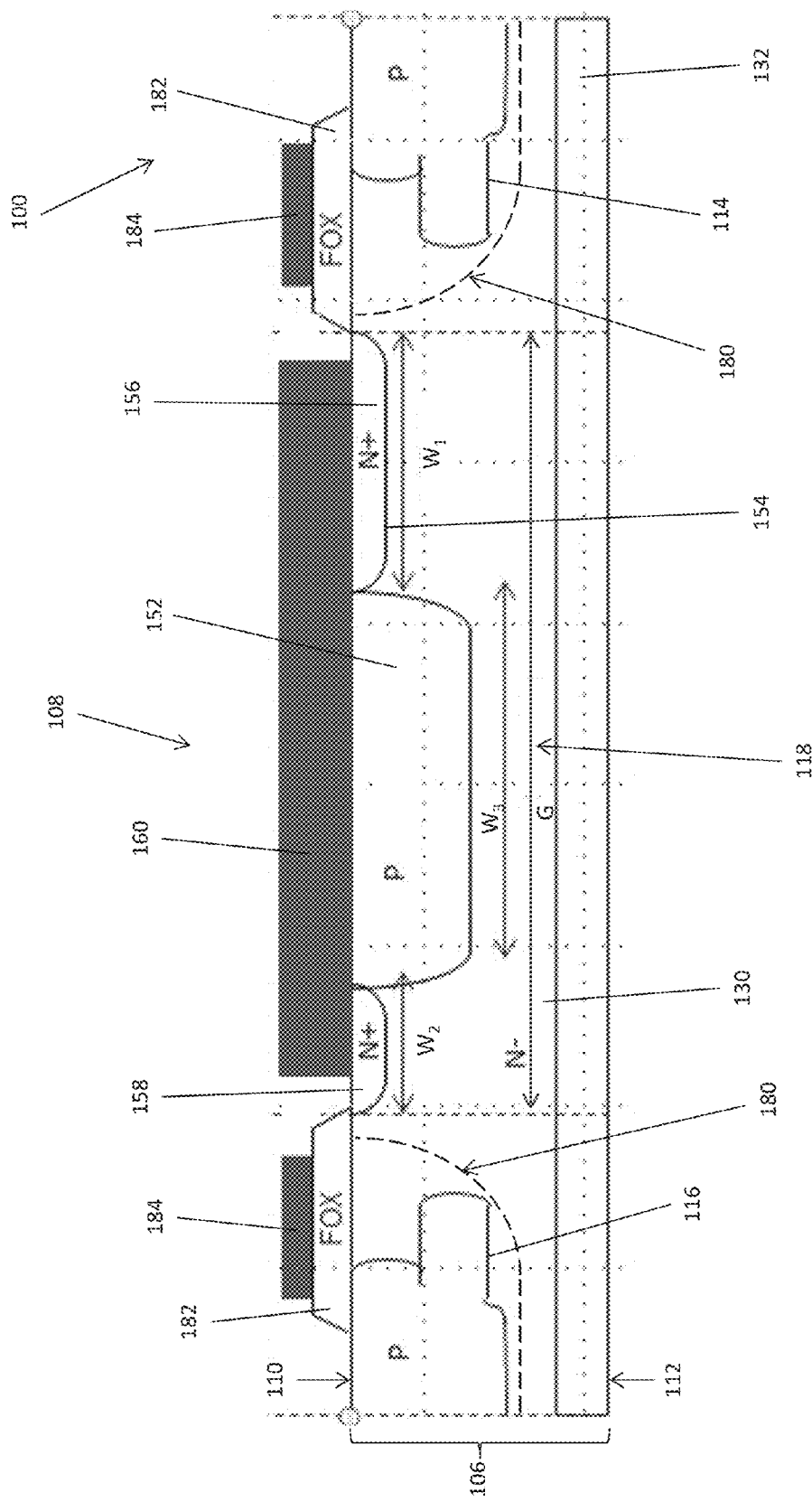
FIG. 3 illustrates a sectional view of yet another embodiment of a semiconductor device that includes power and logic devices integrated in the same semiconductor substrate, and a minority carrier conversion structure.

FIG. 3 illustrates yet another embodiment of a semiconductor device that includes a power device well 114 and a logic device well 116 integrated in the same semiconductor substrate 106 with the minority carrier conversion structure 108. The second doped region 154 of the minority carrier conversion structure 108 is disposed on both sides of the first doped region 152 of the conversion structure 108 in close proximity to the power device and logic device wells 114, 116 according to this embodiment. As a result, the second doped region 154 of the minority carrier conversion structure 108 also forms a channel stop region adjacent both wells 114, 116 at the first surface 110 of the semiconductor substrate 106.

In more detail, the wider part 156 of the second doped region 154 terminates the power device well 114. The narrower part 158 of the second doped region 154 terminates the logic device well 116. By heavily doping the second doped region 154 (e.g. N+ as shown in FIG. 3) and of the same conductivity type as the drift region 130 (e.g. N− also as shown in FIG. 3), both wells 114, 116 are effectively terminated to prevent surface channels. This way, the depletion region edge 180 in the forward blocking mode stays under the well edge construction of the power and logic device wells 114, 116, respectively. The well edge construction can include a relatively thick dielectric 182 such as a field oxide (FOX) and a field plate 184 on the thick dielectric 182. Accordingly, the highly doped regions 156, 158 of the second doped region 154 prevent surface channels reaching the first doped region 152 of the conversion structure 108 in the forward blocking mode and aid the minority carrier conversion process in the reverse biased mode.

There is a balance between maximizing the collecting width ($W_3$) of the first doped region 152 of the minority carrier conversion structure 108, and separating the collecting width of the first doped region 152 from the injecting junction of the power device 100. This balancing leads to an asymmetric configuration with a narrower part 158 of the second doped region 154 of the conversion structure 108 next to the logic device well 116 and a wider part 156 of the second doped region 154 next to the (injecting) power device well 114 as the optimum design.

In one embodiment, the width ($W_1$) of the wider part 156 of the second doped region 154 ranges between 10% and 40% of the gap (G) between the wells 114, 116 where the gap G corresponds to the width of the separation region 118 between the wells 114, 116. The width ($W_2$) of the narrower part 158 of the second doped region 154 ranges between 1% and 9% of the gap G between the wells 114, 116, and the width ($W_3$) of the first doped region 152 of the minority carrier conversion structure 108 ranges between 60% and 90% of the gap G.

Figure 4:
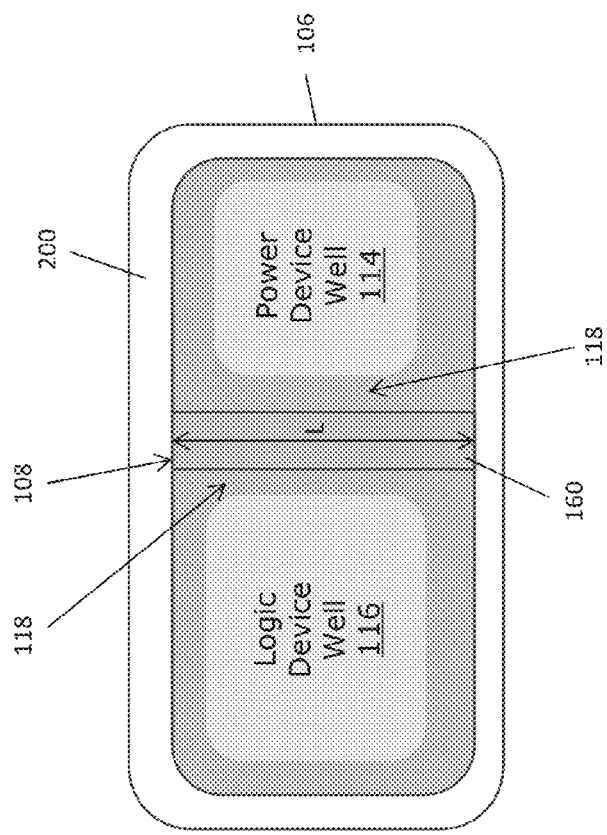
FIG. 4 illustrates a top plan view of an embodiment of a semiconductor device that includes power and logic devices integrated in the same semiconductor substrate, and a minority carrier conversion structure.

FIG. 4 illustrates a top plan view of the semiconductor device with the minority carrier conversion structure 108, according to an embodiment. The semiconductor device includes an edge region 200 around the periphery of the substrate 106, a power device well 114 with a power device and a logic device well 116 with the logic devices. According to this embodiment, the minority carrier conversion structure 108 has a strip shape i.e. long and narrow over a length (L) of the conversion structure 108 between the wells 114, 116. Further according to this embodiment, all of the logic devices included in the semiconductor device are disposed in a single logic device well 116.

Figure 5:
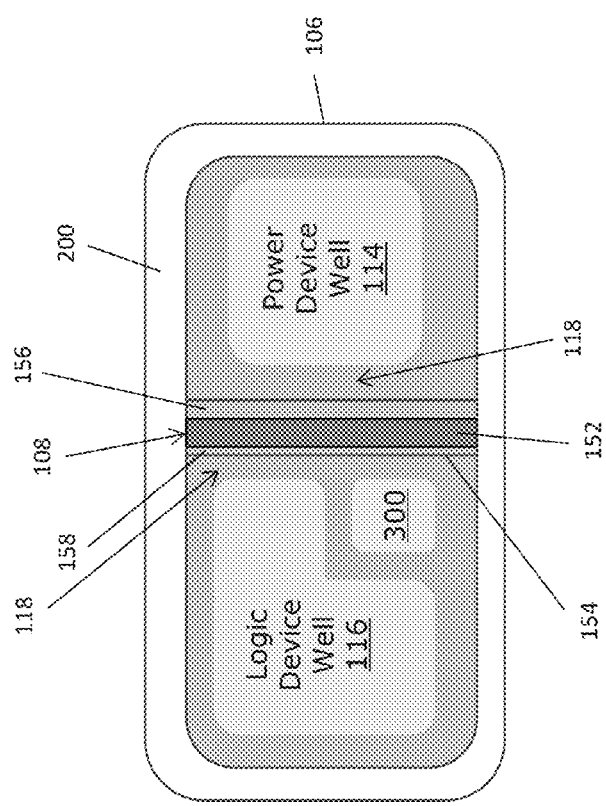
FIG. 5 illustrates a top plan view of another embodiment of a semiconductor device that includes power and logic devices integrated in the same semiconductor substrate, and a minority carrier conversion structure.

FIG. 5 illustrates a top plan view of the semiconductor device with the minority carrier conversion structure 108, according to another embodiment. The embodiment shown in FIG. 5 is similar to the embodiment shown in FIG. 4, however, the semiconductor device further comprises an additional logic device well 300 extending into the semiconductor substrate 106 from the first surface 110 and spaced apart from the power device well 114 by the separation region 118. Logic devices are disposed in the additional logic device well 300 e.g. similar to previously described herein with regard to the first logic device well 116. The first doped region 152 of the minority carrier conversion structure 108 is disposed closer to the additional logic device well 300 than to the power device well 114. The second doped region 154 of the minority carrier conversion structure 108 is wider between the first doped region 152 and the power device well 114 than between the first doped region 152 and the logic device wells 116, 300. The conducting layer 160 of the minority carrier conversion structure 108 is not shown in FIG. 5 so that the location of the doped regions 152, 154 of the conversion structure 108 with respect to the different wells 114, 116, 300 is visible.

In one embodiment, the logic device wells 116, 300 have different potentials when the power device 100 is forward biased, but are both switched to the same negative substrate potential ($-V_{SUB}$) when the power device 100 is reverse biased. As such, the semiconductor substrate 106 is free of the minority carrier conversion structure 108 between the logic device wells 116, 300 because there is no appreciable potential difference between the logic device wells 116, 300 during reverse bias. In the reverse bias mode, the first doped region 152 of the minority carrier conversion structure 108 intercepts minority carriers injected from the power device well 114 into the semiconductor substrate 106. The conducting layer 160 (not shown in FIG. 5) of the conversion structure 108 effectively converts the minority carriers intercepted by the first doped region 152 into majority carriers. The second doped region 154 of the conversion structure 108 receives more of the majority carriers from the semiconductor substrate 106 between the first doped region 152 and the power device well 114 than between the first doped region 152 and the logic device wells 116, 300 as previously described herein. If the logic device wells 116, 300 are switched to different potentials when the power device 100 is reverse biased, then the same or additional minority carrier conversion structure 108 can be disposed between the logic device wells 116, 300 to suppress parasitic lateral current flow between the differently biased logic device wells 116, 300 as previously described herein in the context of the power device and logic device wells 114, 116.

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a semiconductor substrate having opposing first and second main surfaces;
   a first well extending into the semiconductor substrate from the first main surface;
   a vertical power device disposed partly in the first well and having a vertical current path that extends in a direction perpendicular to the first and second main surfaces;
   a second well extending into the semiconductor substrate from the first surface and spaced apart from the first well by a separation region of the semiconductor substrate;
   a plurality of logic devices disposed in the second well; and
   a minority carrier conversion structure in the separation region, the minority carrier conversion structure comprising a first doped region of the same conductivity type as the first and second wells that extends into the semiconductor substrate from the first main surface, a second doped region of the opposite conductivity type as the first doped region that extends into the semiconductor substrate from the first main surface, and a conducting layer that connects the first and second doped regions,
   wherein the first doped region is disposed closer to the second well than to the first well,
   wherein the second doped region is wider between the first doped region and the first well than between the first doped region and the second well.

2. The semiconductor device of claim 1, wherein the vertical power device comprises a vertical power transistor and a free-wheeling diode connected antiparallel with the vertical power transistor, wherein the second well is connected to a negative potential of the semiconductor substrate when the vertical power transistor is reverse-biased and the free-wheeling diode is conducting, wherein the first doped region of the minority carrier conversion structure intercepts minority carriers injected from the first well into the semiconductor substrate when the vertical power transistor is reverse-biased and the free-wheeling diode is conducting, and wherein the second doped region of the minority carrier conversion structure receives more majority carriers from the semiconductor substrate between the first doped region and the first well than between the first doped region and the second well.

3. The semiconductor device of claim 1, wherein all of the logic devices included in the semiconductor device are disposed in the second well.

4. The semiconductor device of claim 1, wherein the minority carrier conversion structure has a strip shape over a length of the minority carrier conversion structure between the first and second wells.

5. The semiconductor device of claim 1, further comprising:
a third well extending into the semiconductor substrate from the first surface and spaced apart from the first well by the separation region; and
a plurality of additional logic devices disposed in the third well,
wherein the first doped region of the minority carrier conversion structure is disposed closer to the third well than to the first well,
wherein the second doped region of the minority carrier conversion structure is wider between the first doped region and the first well than between the first doped region and the third well.

6. The semiconductor device of claim 5, wherein the semiconductor substrate is free of the minority carrier conversion structure between the second and third wells.

7. The semiconductor device of claim 1, wherein the first and second wells are doped p-type, wherein the first doped region of the minority carrier conversion structure is doped p-type, and wherein the second doped region of the minority carrier conversion structure is doped n-type.

8. A semiconductor device, comprising:
a power device well in a semiconductor substrate;
a logic device well in the semiconductor substrate and spaced apart from the power device well by a separation region of the semiconductor substrate; and
a minority carrier conversion structure comprising a first doped region of a first conductivity type in the separation region, a second doped region of a second conductivity type in the separation region, and a conducting layer connecting the first and second doped regions,
wherein the second doped region comprises a first part interposed between the first doped region and the power device well and a second part interposed between the first doped region and the logic device well,
wherein the first and second parts are adjacent to and in direct contact with opposing side surfaces of the first doped region.

9. The semiconductor device of claim 8, further comprising:
a vertical power transistor and a free-wheeling diode connected antiparallel with the vertical power transistor in the power device well,
wherein the logic device well is connected to a negative potential of the semiconductor substrate when the vertical power transistor is reverse-biased and the free-wheeling diode is conducting,
wherein the first doped region of the minority carrier conversion structure intercepts minority carriers injected from the power device well into the semiconductor substrate when the vertical power transistor is reverse-biased and the free-wheeling diode is conducting,
wherein the second doped region of the minority carrier conversion structure receives more majority carriers from the semiconductor substrate between the first doped region and the power device well than between the first doped region and the logic device well.

10. The semiconductor device of claim 8, wherein the logic device well is the only logic device well included in the semiconductor substrate.

11. The semiconductor device of claim 8, wherein the minority carrier conversion structure has a strip shape over a length of the minority carrier conversion structure between the power device well and logic device well.

12. The semiconductor device of claim 8, further comprising:
an additional logic device well in the semiconductor substrate and spaced apart from the power device well by the separation region.

13. The semiconductor device of claim 12, wherein the first doped region of the minority carrier conversion structure is disposed closer to the additional logic device well than to the power device well.

14. The semiconductor device of claim 12, wherein the second doped region of the minority carrier conversion structure is wider between the first doped region and the power device well than between the first doped region and the additional logic device well.

15. The semiconductor device of claim 12, wherein the semiconductor substrate is free of the minority carrier conversion structure between the logic device well and the additional device well.

16. The semiconductor device of claim 8, wherein the logic device well and the power device well are doped p-type, wherein the first doped region of the minority carrier conversion structure is doped p-type, and wherein the second doped region of the minority carrier conversion structure is doped n-type.

17. The semiconductor device of claim 8, wherein the first doped region is disposed closer to the logic device well than to the power device well.

18. The semiconductor device of claim 8, wherein the first part of the second doped region is wider than the second part.

19. A semiconductor device, comprising:
a semiconductor substrate having opposing first and second main surfaces;
a power device well extending into the semiconductor substrate from the first main surface;
a logic device well extending into the semiconductor substrate from the first main surface and spaced apart from the power device well by a separation region of the semiconductor substrate; and
a minority carrier conversion structure in the separation region, the minority carrier conversion structure comprising a first doped region of a first conductivity type that extends into the semiconductor substrate from the first main surface, a second doped region of a second conductivity type that extends into the semiconductor substrate from the first main surface, and a conducting layer that connects the first and second doped regions,
wherein the first doped region extends through the second doped region in a direction perpendicular to the first and second main surfaces, such that the second doped region has a first part interposed between the first doped region and the power device well and a second part interposed between the first doped region and the logic device well, wherein the first and second parts are adjacent to and in direct contact with opposing side surfaces of the first doped region.

20. The semiconductor device of claim 19, wherein the first doped region is off-centered within the second doped region such that the second doped region is wider between the first doped region and the power device well than between the first doped region and the logic device well.

* * * * *

UNITED STATES PATENT AND TRADEMARK OFFICE
CERTIFICATE OF CORRECTION

PATENT NO. : 9,590,091 B2  
APPLICATION NO. : 14/466198  
DATED : March 7, 2017  
INVENTOR(S) : A. Finney et al.

Page 1 of 1

It is certified that error appears in the above-identified patent and that said Letters Patent is hereby corrected as shown below:

Column 10, Line 31 (Claim 15, Line 4) please change "additional device" to -- additional logic device --

Signed and Sealed this  
Sixth Day of June, 2017

Michelle K. Lee  
*Director of the United States Patent and Trademark Office*